United States Patent
Wilson

(10) Patent No.: US 10,684,397 B2
(45) Date of Patent: Jun. 16, 2020

(54) REFRACTIVE COATINGS FOR A COLORED SURFACE OF AN ELECTRONIC DEVICE

(71) Applicant: Apple Inc., Cupertino, CA (US)

(72) Inventor: James R. Wilson, San Jose, CA (US)

(73) Assignee: Apple Inc., Cupertino, CA (US)

( * ) Notice: Subject to any disclaimer, the term of this patent is extended or adjusted under 35 U.S.C. 154(b) by 244 days.

(21) Appl. No.: 15/254,826

(22) Filed: Sep. 1, 2016

(65) Prior Publication Data
US 2017/0068021 A1    Mar. 9, 2017

Related U.S. Application Data

(60) Provisional application No. 62/215,625, filed on Sep. 8, 2015.

(51) Int. Cl.
G02B 5/02 (2006.01)
G02B 13/20 (2006.01)
(Continued)

(52) U.S. Cl.
CPC ......... *G02B 5/0242* (2013.01); *C01G 23/047* (2013.01); *C03C 17/007* (2013.01); *C03C 17/009* (2013.01); *C09D 5/004* (2013.01); *C09D 7/68* (2018.01); *C09D 7/70* (2018.01); *C09D 133/04* (2013.01); *C09D 163/00* (2013.01);
(Continued)

(58) Field of Classification Search
CPC .. G02B 5/0242; G02B 5/0278; G02B 5/0236; G02B 5/0268; G02B 5/0221
See application file for complete search history.

(56) References Cited

U.S. PATENT DOCUMENTS 5,774,265 A    6/1998  Mathers et al.
6,813,094 B2  11/2004  Kaminsky et al.
(Continued)

FOREIGN PATENT DOCUMENTS

CN    101124273    2/2008
CN    102308231    1/2012
(Continued)

OTHER PUBLICATIONS

Eiden-Assmann et al., "Synthesis and Characterization of Porous and Nonporous Monodisperse Colloidal $TiO_2$ Particles," *Chem. Mater.*, 2004, vol. 16, pp. 6-11.
(Continued)

*Primary Examiner* — William R Alexander
*Assistant Examiner* — Tamara Y. Washington
(74) *Attorney, Agent, or Firm* — Polsinelli PC

(57) ABSTRACT

A refractive coating such as a white layer is disposed on a housing component of a portable electronic device. The refractive coating includes pigment particles such as titanium dioxide suspended in a carrier medium such as a polymer matrix. The pigment particles each define air pores or other voids formed by at least partially sintering the pigment particles. A difference in refractive index between the air pores and the pigment particles is greater than that between the carrier medium and the pigment particles. Incident light is refracted at interfaces between the pigment particles and the air pores, increasing light refracted by the refractive coating compared to refractive coatings including pigment particles lacking the air pores.

14 Claims, 8 Drawing Sheets

(51) Int. Cl.
*C09D 5/33* (2006.01)
*C09D 7/40* (2018.01)
*H05K 5/00* (2006.01)
*H05K 5/03* (2006.01)
*C03C 17/00* (2006.01)
*C01G 23/047* (2006.01)
*C09D 133/04* (2006.01)
*C09D 163/00* (2006.01)
*C09D 167/00* (2006.01)
*C08K 3/22* (2006.01)
*C08K 7/22* (2006.01)

(52) U.S. Cl.
CPC ......... *C09D 167/00* (2013.01); *G02B 5/0268* (2013.01); *H05K 5/0004* (2013.01); *H05K 5/0017* (2013.01); *H05K 5/0086* (2013.01); *H05K 5/03* (2013.01); *C03C 2217/445* (2013.01); *C03C 2217/45* (2013.01); *C03C 2217/452* (2013.01); *C03C 2217/477* (2013.01); *C03C 2217/485* (2013.01); *C03C 2217/72* (2013.01); *C08K 3/22* (2013.01); *C08K 7/22* (2013.01); *C08K 2003/2241* (2013.01)

(56) References Cited

U.S. PATENT DOCUMENTS

| | | | |
|---|---|---|---|
| 6,842,282 | B2 | 1/2005 | Kuroda et al. |
| 7,760,424 | B2 | 7/2010 | Takeuchi et al. |
| 7,924,368 | B2 | 4/2011 | Fabick et al. |
| 8,009,351 | B2 | 8/2011 | Ando et al. |
| 8,133,938 | B2 | 3/2012 | Munro et al. |
| 8,384,630 | B2 | 2/2013 | Ray et al. |
| 9,030,736 | B2 | 5/2015 | Sadahiro et al. |
| 9,081,171 | B2 | 7/2015 | Dean et al. |
| 10,114,237 | B2 | 10/2018 | Wilson |
| 2003/0017316 | A1 | 1/2003 | Pfaff et al. |
| 2004/0104663 | A1 | 6/2004 | Umeya et al. |
| 2004/0166316 | A1 | 8/2004 | Noguchi |
| 2005/0206020 | A1 | 9/2005 | Baek et al. |
| 2007/0103799 | A1 | 5/2007 | Chiang et al. |
| 2009/0015908 | A1 | 1/2009 | Ando et al. |
| 2010/0330331 | A1 | 12/2010 | Chiang et al. |
| 2011/0269075 | A1* | 11/2011 | Wang ............... G02B 5/201 430/321 |
| 2012/0188295 | A1 | 7/2012 | Joo |
| 2012/0218653 | A1 | 8/2012 | Liu et al. |
| 2013/0133739 | A1 | 5/2013 | Kohnke et al. |
| 2013/0194668 | A1 | 8/2013 | Liang et al. |
| 2013/0199995 | A1 | 8/2013 | Jiang et al. |
| 2014/0178647 | A1 | 6/2014 | Kim et al. |
| 2014/0233161 | A1 | 8/2014 | Liu |
| 2014/0295127 | A1 | 10/2014 | Tang et al. |
| 2015/0062709 | A1 | 3/2015 | Matsuyuki et al. |
| 2015/0177420 | A1* | 6/2015 | Fujii ............... G02B 1/04 359/601 |
| 2015/0234098 | A1 | 8/2015 | Lofftus et al. |
| 2015/0316686 | A1 | 11/2015 | Vanier et al. |
| 2016/0377768 | A1 | 12/2016 | Wilson et al. |
| 2017/0075386 | A1 | 3/2017 | Park |
| 2017/0090084 | A1 | 3/2017 | Wilson et al. |
| 2017/0139088 | A1* | 5/2017 | Iki ............... G02B 5/0242 |
| 2017/0174565 | A1 | 6/2017 | Kase et al. |
| 2017/0321069 | A1* | 11/2017 | Zhao ............... C09D 7/61 |
| 2017/0362503 | A1 | 12/2017 | Mohr et al. |
| 2018/0057693 | A1 | 3/2018 | Wilson |
| 2018/0059443 | A1 | 3/2018 | Wilson |

FOREIGN PATENT DOCUMENTS

| | | |
|---|---|---|
| DE | 102012109808 | 6/2014 |
| EP | 1170618 | 1/2002 |
| JP | 2002-240423 | 8/2002 |
| JP | 2002277903 A * | 9/2002 |
| KR | 10-2013-0123009 | 11/2013 |
| KR | 101336936 | 12/2013 |
| WO | WO 01/03945 | 1/2001 |
| WO | WO 2010/096914 | 9/2010 |
| WO | WO 2015/086858 | 6/2015 |
| WO | WO 2016/006538 | 1/2016 |

OTHER PUBLICATIONS

Wang et al, "Rapid Microwave Synthesis of Porous $TiO_2$ Spheres and Their Applications in Dye-Sensitized Solar Cells," *The Journal of Physical Chemistry*, 2011, vol. 115, pp. 10419-10425.

Lou et al., "The Fabrication of TiO2 Porous Ceramic Structure," Journal of Shanghai Jiaotong University, No. 2, 314, Dec. 2007, pp. 306-309.

* cited by examiner

REFRACTIVE COATINGS FOR A COLORED SURFACE OF AN ELECTRONIC DEVICE

CROSS-REFERENCE TO RELATED APPLICATIONS

This application claims the benefit of U.S. Provisional Application Ser. No. 62/215,625, filed Sep. 8, 2015, and entitled "REFRACTIVE COATINGS FOR A COLORED SURFACE OF AN ELECTRONIC DEVICE which is incorporated herein by reference in its entirety.

FIELD

The described embodiments relate generally to optically refractive coatings. More particularly, the present embodiments relate to enhancing an amount of light refracted and/or reflected by a refractive coating by creating void spaces in pigment particles suspended in a carrier medium of the coating, thereby increasing index of refraction differences.

BACKGROUND

Optically refractive materials diffusely refract light by scattering or bending light waves incident thereon. The eyes of an observer perceive brightness associated with the amount of light scattered from the surface. Various devices or structures, such as portable electronic devices, may be coated with optically refractive materials for functional and/or aesthetic purposes. For example, white surfaces are often used to impart a clean look and feel to a device. The greater the amount of light scattered by the white surface, the brighter and whiter the white surface appears to the eyes of an observer.

A portion of light incident to an optically refractive material may be reflected by the material and a portion may penetrate the material. When light that penetrates encounters an interface between different materials (such as between a carrier medium of the material and tinting pigments or other particles suspended in the medium), the direction of the light changes. This scattering event refracts the light. The greater the difference or mismatch in the indexes of refraction of the different materials, the larger the angle of the light's changed direction. Larger angles as compared to smaller ones result in the light encountering fewer interfaces (e.g., less scattering events) and penetrating less deeply into the optically refractive material before being refracted back out. As a result, the optically refractive material absorbs less and scatters more light.

SUMMARY

A refractive coating, such as a white layer, is disposed on a housing component of a portable electronic device. The refractive coating includes pigment particles such as titanium dioxide suspended in a carrier medium such as a polymer matrix. The pigment particles each define voids or other pores formed by at least partially sintering the pigment particles. A difference in refractive index between the voids and the pigment particles is greater than that between the carrier medium and the pigment particles. Incident light is refracted at interfaces between the pigment particles and the voids, increasing light refracted by the refractive coating compared to refractive coatings including pigment particles lacking the voids.

In various embodiments, a portable electronic device includes a housing component and a layer disposed on the housing component. The layer includes a matrix and pigment particles suspended in the matrix, each particle defining one or more voids. A difference in refractive indexes between the voids and the pigment particles is greater than a difference in refractive indexes between the polymer matrix and the pigment particles.

In various examples, the carrier medium or matrix permits incident light to travel through the voids to the pigment particles. The layer may refract at least 15% of incident light. In some examples, the pigment particles are titanium dioxide. The matrix may be a polymer. In various examples, the housing component is transparent and the layer is a white ink disposed on an interior surface of the housing component. The housing component may be a cover glass of a display.

In some embodiments, a refractive coating includes a carrier medium (such as a ceramic) and porous pigment particles suspended in the carrier medium. Incident light is refracted at an interface between the porous pigment particles and voids defined by the porous pigment particles. A difference in refractive indexes between the porous pigment particles and the voids may be greater than one.

In various examples, the refractive coating is at least one of ink or paint. The porous pigment particles may be between 200 and 300 nanometers in diameter. The porous pigment particles may be titanium dioxide matrixes with air bubbles suspended therein.

In various embodiments, a method for forming a coating includes forming a slurry including titanium dioxide particles, heating the slurry to at least partially sinter the titanium dioxide particles, and mixing the at least partially sintered titanium dioxide particles in a polymer matrix. In various examples, the method may further include applying the mixed at least partially sintered titanium dioxide particles and polymer matrix to a surface of a portable electronic device.

In some examples, the operation of heating the slurry defines voids in the at least partially sintered titanium dioxide particles. The operation of heating the slurry may include heating the slurry to a temperature between 800 to 1100 degrees Celsius for a period of time under or equal to six hours.

In various examples, the operation of forming the slurry further includes forming the slurry including a material that is burned out by the operation of heating the slurry. The material may be one of water, a solvent, a carbon fiber, a binder, or a polymer micro-bead (such as polytetrafluoroethylene or polyethylene).

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
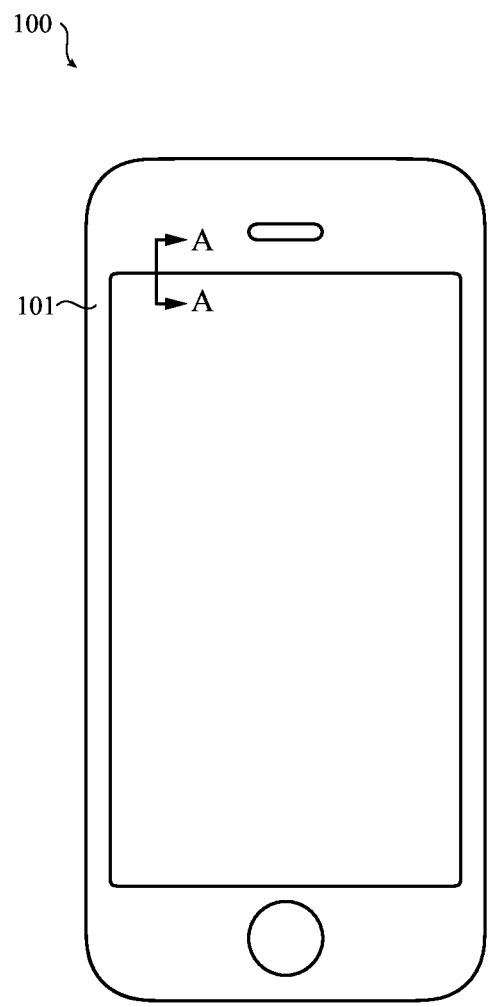
FIG. 1 depicts a portable electronic device having a refractive coating.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The description that follows includes sample systems, methods, and apparatuses that embody various elements of the present disclosure. However, it should be understood that the described disclosure may be practiced in a variety of forms in addition to those described herein.

The following disclosure relates to a refractive material, such as a coating, disposed on a surface of a portable electronic device. The refractive material includes particles suspended in a carrier medium; each particle defines one or more voids or pores therein. The difference between the refractive indexes of the voids/pores and the particles is greater than that between the carrier medium and the particles. Incident light is refracted at interfaces between the voids and the particles instead of (or in addition to) interfaces between the carrier medium and the particles. As a result, more light is refracted by the refractive material than if particles without voids were used in a coating. Thus, the refractive material may appear brighter to the eyes of an observer. In implementations where the refractive material is white, the refractive material may also appear whiter.

In various implementations, the particles may be light-scattering, tinting pigment particles. Such particles may be titanium dioxide ($TiO_2$). The $TiO_2$ particles may be approximately between 200 and 300 nanometers in diameter. The voids may be defined by at least partially sintering, lasering, and/or performing other processes to remove portions of the $TiO_2$ particles. The voids may be filled with air or other gases, or may be a vacuum. The voids may extend through an exterior of the $TiO_2$ particles and/or may be disposed completely within the $TiO_2$ particles.

In some examples, the $TiO_2$ particles may be hollow spheres with the voids taking the form of air, gas, or vacuum pockets in hollow interiors of the spheres. However, it is understood that this is an example. In various implementations, the $TiO_2$ particles may be variously shaped. In some examples, a variety of shapes may be used.

For example, a slurry may be formed including $TiO_2$ particles and other materials such as binders, carbon fibers, water, micro-beads (which may be formed of a fluoropolymer or other polymer such as polytetrafluoroethylene or polyethylene), and so on. The slurry may be heated to at least partially sinter the $TiO_2$ particles and burn out one or more of the other materials to define the voids (forming $TiO_2$ matrixes with air bubbles). The at least partially sintered $TiO_2$ particles may be mixed with the carrier medium.

In some implementations, the carrier medium may be a polymer matrix, such as epoxy, polyester, acrylic, and so on. In other implementations, the carrier medium may be a ceramic (such as glass) and/or other materials.

In various implementations, the refractive coating may be ink, plastic, paint, and/or another material. For example, in some implementations, the refractive coating may be a white ink disposed on an interior surface of the transparent cover glass of a display.

These and other embodiments are discussed below with reference to FIGS. 1-6. However, those skilled in the art will readily appreciate that the detailed description given herein with respect to these Figures is for explanatory purposes only and should not be construed as limiting.

FIG. 1 depicts a portable electronic device 100 having a refractive coating (see FIG. 2, 202) disposed on a housing component 101. The refractive coating includes particles (see FIG. 3, 304) suspended in a carrier medium (see FIG. 3, 311) that each define voids (see FIG. 3, 305) or pores. Light incident to the housing component 101 may be refracted at interfaces between the air pores and the particles instead of interfaces between the carrier medium and the particles. As a result, more light is refracted by the refractive coating than if particles without air pores were used. This may enable use of thinner refractive coatings than if particles without air pores were used. Thus, the refractive coating may appear brighter to the eyes of an observer.

Figure 2:
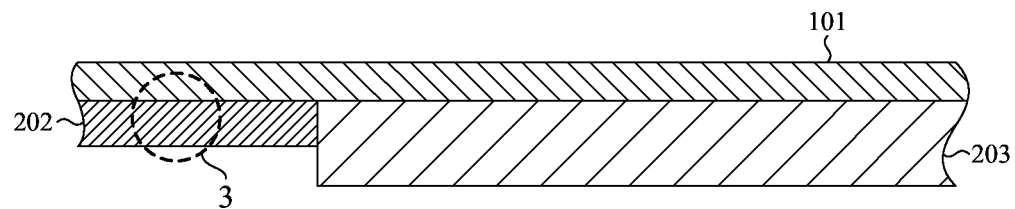
FIG. 2 depicts a partial cross-sectional view of the portable electronic device of FIG. 1, taken along line A-A of FIG. 1.

FIG. 2 depicts a partial cross-sectional view of the portable electronic device 100 of FIG. 1, taken along line A-A of FIG. 1. The housing component 101 may be a cover glass for a display 203 and a refractive coating 202 may form a mask border around the display 203 on an interior surface of the housing component 101 (e.g., cover glass). Alternatively, the refractive coating 202 may mask or be applied to any other region, and can be above or around components other than a cover glass such as a housing, input areas, and so on.

In this example, the coating 202 may be a white layer of ink. The increased light refracted by the coating 202 may cause the coating 202 to appear brighter and whiter to the eyes of an observer than traditional white layers of ink. However, in other examples, the coating 202 may be any or all of a variety of different materials such as plastics, paints, and so on without departing from the scope of the present disclosure.

Figure 3:
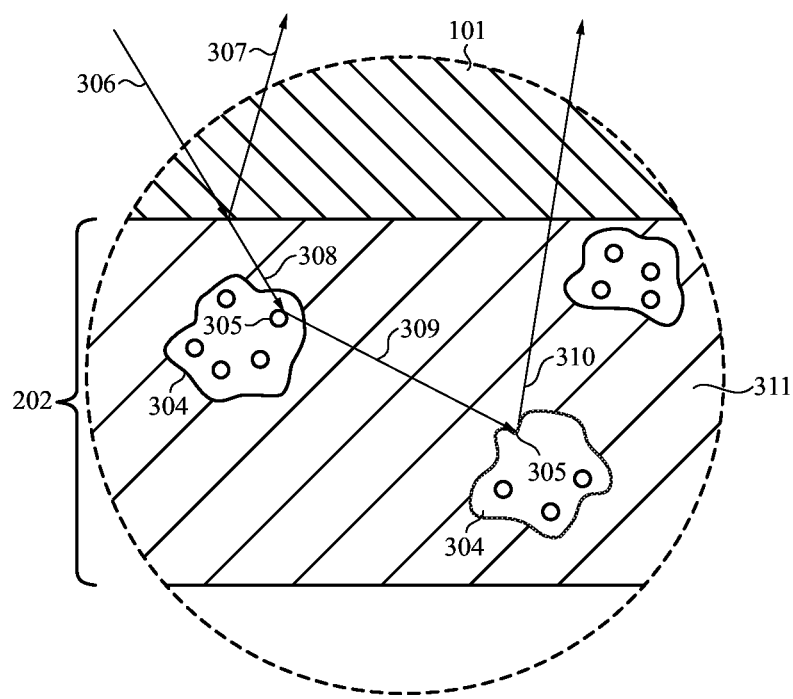
FIG. 3 depicts a detail view of an example implementation of the indicated portion of FIG. 2.

FIG. 3 depicts a detail view of an example implementation of the indicated portion of FIG. 2. The coating 202 may include pigment particles 304 suspended in a carrier medium 311. Such a carrier medium 311 may not readily absorb light. In this example, the carrier medium 311 may be a polymer matrix (e.g., epoxy, polyester, acrylic, and so on). However, in other implementations, the carrier medium 311 may be other materials, such as glass or other ceramics.

The pigment particles 304 may be $TiO_2$ particles, though this is an example and other materials may be used. $TiO_2$ particles have a number of properties that make them suitable for use as a white pigment. First, $TiO_2$ particles have a high index of refraction (approximately 2.5-2.75). Second, $TiO_2$ particles have a low light absorption across the visible spectrum. There are multiple types of $TiO_2$ particles that may be used as the pigment particles 304, such as anatase, brookite, and rutile. Rutile has a higher index of refraction than anatase or brookite and so may be used in certain embodiments. The $TiO_2$ particles may be approximately between 200 and 300 nanometers in diameter or dimension (such as a largest dimension), although particles of greater or smaller size may be used in other embodiments.

The pigment particles 304 may include voids 305 (also encompassing pores, air pores, and bubbles). The voids 305 may be air or other gas pockets. Alternatively, the voids 305 may be vacuums. The voids 305 may extend through or from an exterior surface of the pigment particles 304, be embedded within or otherwise surrounded by the pigment particles 304, and so on.

The voids 305 may have a lower refractive index than the carrier medium 311 (though in some implementations the voids 305 may have a higher refractive index than the carrier medium 311). For example, a polymer matrix may have a refractive index of 1.5, similar to glass. However, the voids 305 may be air voids 305 with a refractive index of about 1. Since the voids 305 have a lower refractive index than the carrier medium 311, there is a greater difference or mismatch between the refractive indexes between the voids 305 and the pigment particles 304 (greater than one in this example, approximately 1.5-1.75) than between the carrier medium 311 and the pigment particles 304 (approximately one). As a result, incident light is refracted at greater angle at interfaces (e.g., the transition between different materials) between the voids 305 and the pigment particles 304 than would be at interfaces between the carrier medium 311 and the pigment particles 304.

In other words, the voids 305 may result in incident light traveling from the carrier medium 311 through the voids 305 to the pigment particles 304 (the carrier medium 311 permits incident light to travel through the voids 305 to the pigment particles 304), thus refracting light at the boundary or interface between the pigment particles 304 and the voids 305. This may result in greater refraction, as compared to that of incident light in a carrier medium 311 with pigment particles 304 lacking voids.

Light 306 incident on a surface of the coating 202 may be partially reflected (shown as reflected portion 307) and may partially penetrate (shown as penetrating portion 308). In this example, the penetrating portion 308 of the incident light 306 may encounter a first interface between a pigment particle 304 and a void 305, changing the direction of the penetrating portion 308 and refracting it as refracted light 309. This first interface may be on an exterior of the pigment particle 304 or an interior of the pigment particle; both are shown in FIG. 3. The refracted light 309 may encounter a second interface between another pigment particle 304 and a void 305 defined therein or thereon, thus changing the direction of the refracted light 309 and refracting it as further refracted light 310. The further refracted light 310 may be refracted back out of the coating 202.

It is understood that this is an example and that the path of light through the coating 202 may vary widely. Regardless, due to the higher difference or mismatch in indexes of refraction between the pigment particles 304 and the voids 305 as compared to the pigment particles 304 and the carrier medium 311, refraction of light at interfaces between pigment particles 304 and the voids 305 may be at higher angles than if the light was refracted at interfaces between the pigment particles 304 and the carrier medium 311. Thus, fewer scattering events may occur before the penetrating portion 308 is refracted back out of the coating 202. Further, the penetrating portion 308 may not penetrate as deeply into the coating 202 and may not travel as far within the coating 202. As a result, more of the penetrating portion 308 may be refracted back out of the coating 202, causing the coating 202 to appear whiter and brighter to the eyes of an observer than a coating including pigment particles 304 that do not define the voids 305.

Production of the pigment particles 304 may involve forming $TiO_2$ matrixes with air bubbles suspended therein to define the voids 305. These pigment particles 304 may be lasered to define the voids 305. Alternatively, the pigment particles 304 may be formed by sintering (e.g., a process of forming a solid mass of material by heat or pressure without melting the material) or at least partially sintering $TiO_2$ particles.

For example, $TiO_2$ particles may be mixed with water and one or more binders (such as ethyl cellulose or a ceramic powder) or other fillers (such as carbon fibers, polymer micro-beads such as polytetrafluoroethylene, polyethylene, or other fluoropolymers) to form a slurry. In some cases, the slurry may be spray dried to form a powder which may be pressed to form a green state material. The slurry or green state material may be heated to partially sinter the $TiO_2$ particles and burn off the water, binders, and/or fillers and define the voids 305. Various parameters of such a process (such as temperature, time, binder or filler material selection, and so on) may influence the size and dispersion of the voids 305 formed thereby.

In some cases, fully sintering the $TiO_2$ particles may include heating the slurry to a temperature of approximately 1500 degrees Celsius for a certain time, one example of which is 24 hours. To partially sinter the $TiO_2$ particles, the slurry may be heated to a temperature between 800 to 1100 degrees Celsius for a period of time under or equal to six hours, although other embodiments may use different temperatures and/or times.

After the partially sintered porous $TiO_2$ particles (and/or other partially sintered porous pigment particles 304) are formed, they may be mixed with the carrier medium 311 to suspend them in the carrier medium 311. The coating 202 formed thereby may then be applied to a surface.

A coating 202 formed according to such a process may refract at least 15% of incident light. By way of contrast, a coating including $TiO_2$ particles without voids 305 may refract approximately 6% of incident light. As a result, this coating 202 may appear brighter and whiter than a coating including $TiO_2$ particles without voids 305.

Although the coating 202 is illustrated and described above with respect to FIGS. 1-3 as disposed on a housing component 101 of a portable electronic device 100, it is understood that this is an example. In various implementations, the coating 202 may be utilized on exterior and/or interior surfaces of a variety of different devices without departing from the scope of the present disclosure such as a tablet computing device, a laptop computing device, a digital media player, a display, an input device, a non-electronic device, and so on.

Figure 4A:
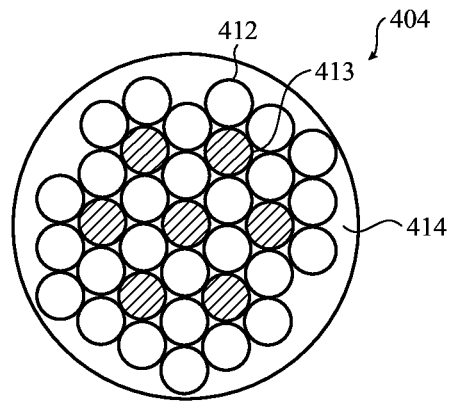
FIG. 4A depicts a matrix of compressed pigment particles, binder particles, and water.

FIG. 4A depicts a matrix 404 of compressed pigment particles 412, binder particles 413 (such as polymer particles, carbon fibers, and so on), and water 414 or a solvent. The matrix 404 may be formed by making a slurry of the pigment particles 412, binder particles 413, and water 414. The slurry may be compressed.

Figure 4B:
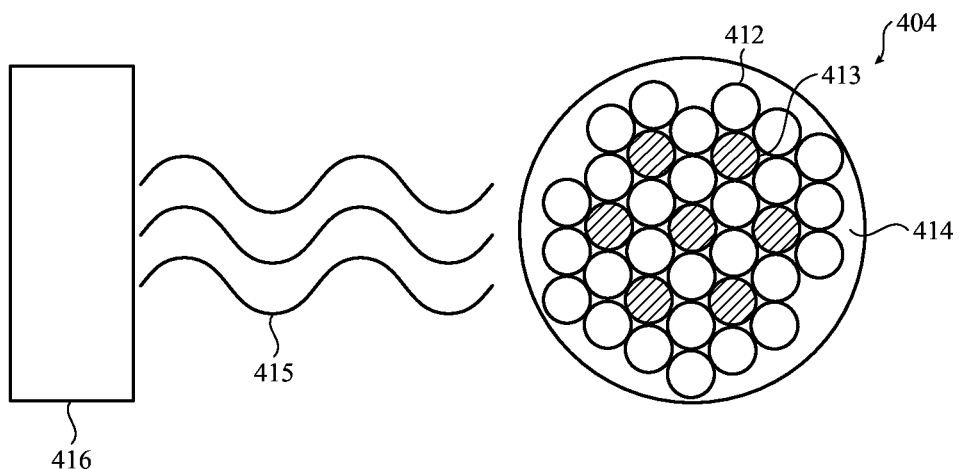
FIG. 4B depicts heating of the matrix of FIG. 4A.

FIG. 4B depicts heating of the matrix 404 of FIG. 4A. The heating may be performed by subjecting the matrix 404 to heat 415 from a heating element 416. The heating may burn off one or more of the binder particles 413 and the water 414. However, it is understood that this is an example. In various implementations, the matrix 404 of FIG. 4A may be spray dried and/or otherwise dried to remove the water 414 before heating.

Figure 4C:
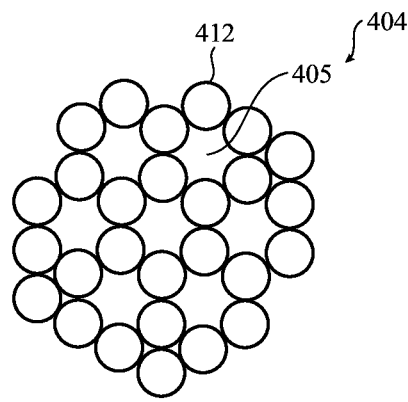
FIG. 4C depicts a matrix of pigment particles and voids or air bubbles formed by burning out the binder particles and water via the heating of FIG. 4B.

FIG. 4C depicts a matrix 404 of pigment particles 412 and voids 405 or air bubbles formed by burning out the binder particles 413 and water 414 via heating of the particles 412. Burning out the binder particles 413 may leave voids 405 where the binder particles 413 previously were located. One or more dimensions of the binder particles 413 may correspond to one or more dimensions of the voids 405 to be created by the heating of FIG. 4B. In various implementations, the matrix 404 may be used as the pigment particles 304 in the coating 202 illustrated and described above with respect to FIGS. 1-3.

Figure 5A:
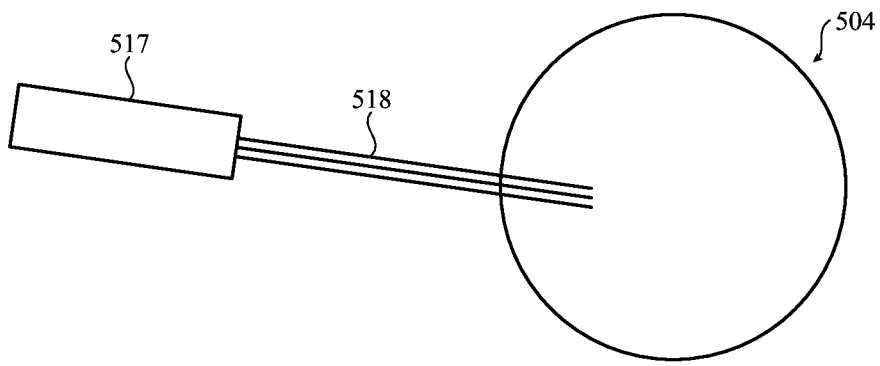
FIG. 5A depicts lasering of a pigment particle.
Figure 5B:
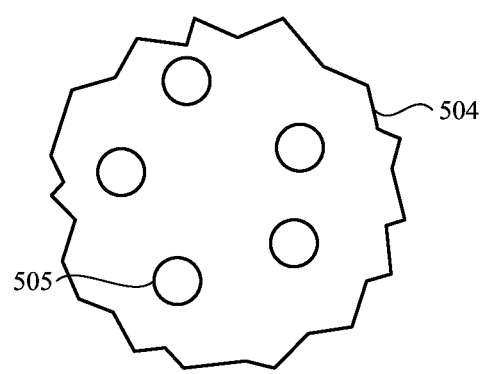
FIG. 5B depicts a porous pigment particle formed by the lasering of FIG. 5B.

FIGS. 5A-5B depicts a pigment particle 504 formed by a laser operation. In some implementations, the pigment particle 504 may be a $TiO_2$ particle. Though only the one pigment particle 504 is illustrated, it is understood that this is an example. In various implementations, the pigment particle 504 may be combined in a slurry with water, one or more solvents, and/or one or more other particles without departing from the scope of the present disclosure.

FIG. 5A depicts lasering of the pigment particle 504. The pigment particle 504 may be subjected to one or more laser beams 518 produced by one or more lasers 517. The laser beam 518 may etch and/or otherwise remove one or more portions of the pigment particle 504. It should be appreciated that multiple such particles may be exposed to a laser substantially simultaneously, although only a single particle is illustrated for purposes of simplicity. Likewise, multiple lasers may be used on one or more particles to form voids.

FIG. 5B depicts a porous pigment particle 504 formed by the lasering of FIG. 5B. The porous pigment particle 504 may include one or more voids 505 or pores. The voids 505 may correspond to where one or more portions of the pigment particle 504 was removed by the laser 518 in FIG. 5B to form the voids 505. In various implementations, the porous pigment particle 504 may be used as the pigment particles 304 in the coating 202 illustrated and described above with respect to FIGS. 1-3.

Although FIGS. 5A-5B illustrate lasering a pigment particle 504 to form voids 505, it is understood that this is an example. Other lasering procedures may be used to form voids 505 without departing from the scope of the present disclosure. For example, in various implementations, a sheet of pigment material rather than pigment particles 504 may be lasered to remove one or more portions and create voids 505.

In some implementations, a pigment particle 504 may have a single void 505. However, in other implementations, multiple voids 505 may be included in a single pigment particle 504 without departing from the scope of the present disclosure.

Figure 6A:
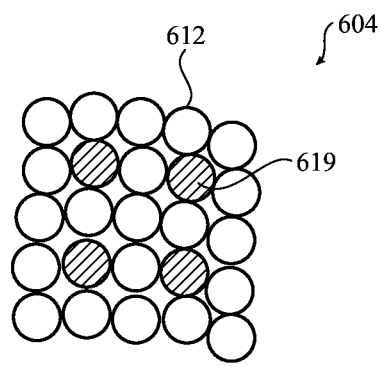
FIG. 6A depicts a matrix of pigment particles bonded by polymer micro-beads.

FIG. 6A depicts a matrix 604 of pigment particles 612 bonded by polymer micro-beads 619. The matrix 604 may be formed by making a slurry of the pigment particles 612 and the polymer micro-beads 619 while the polymer micro-beads 619 are in a liquid and/or semi-liquid form (such as where the polymer micro-beads 619 are molten, suspended in a solvent, and so on). The polymer micro-beads 619 may be transitioned to a solid form to adhere the pigment particles 612 together in the matrix 604.

Figure 6B:
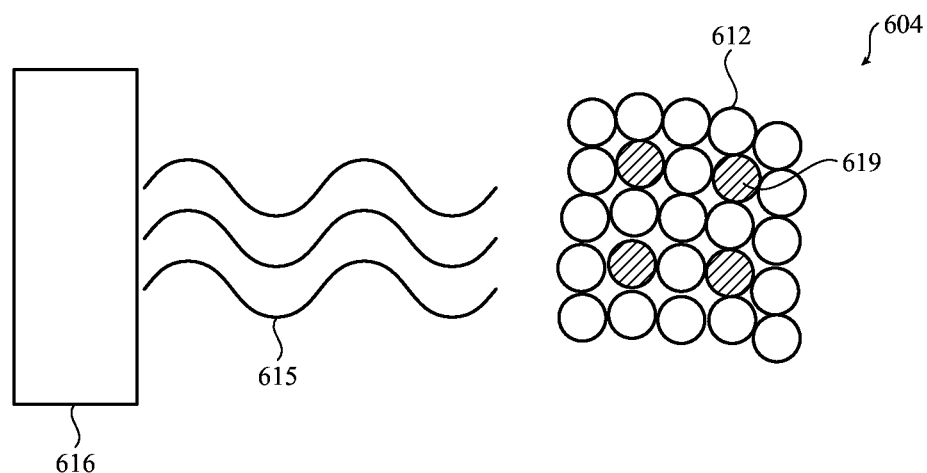
FIG. 6B depicts heating of the matrix of FIG. 6A.

FIG. 6B depicts heating of the matrix of FIG. 6A. The heating may be performed by subjecting the matrix 604 to heat 615 from a heating element 616. The heating may burn off one or more of the polymer micro-beads 619, leaving the pigment particles 612 remaining.

Figure 6C:
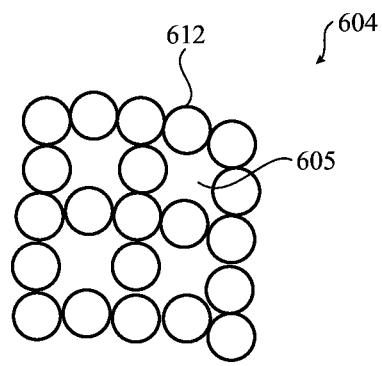
FIG. 6C depicts a matrix of pigment particles and voids or air bubbles formed by burning out the polymer micro-beads particles via the heating of FIG. 6B.

FIG. 6C depicts a matrix 604 of pigment particles 612 and voids 605 or air bubbles. The voids 605 may be formed by burning out the polymer micro-beads particles 619 via the heating of FIG. 6B. Burning out the polymer micro-beads particles 619 may leave the voids 605 where the polymer micro-beads particles 619 previously were located. Burning out of the polymer micro-beads particles 619 may also leave the pigment particles 612 in the configuration they were previously adhered in by the polymer micro-beads particles 619. In various implementations, the matrix 604 may be used as the pigment particles 304 in the coating 202 illustrated and described above with respect to FIGS. 1-3.

Although FIGS. 6A-6C illustrate and describe burning out the polymer micro-beads particles 619 to leave the voids 605, it is understood that this is an example. In some implementations, there may be a high difference between indexes of refraction of the polymer micro-beads particles 619 and the pigment particles 612. In such an example, the polymer micro-beads particles 619 may be allowed to remain rather than being burned out.

Further, in some implementations, one or more liquids may be disposed in the voids 605 without departing from the scope of the present disclosure. Such a liquid may include oil, water, various solutions, and so on.

Figure 7:
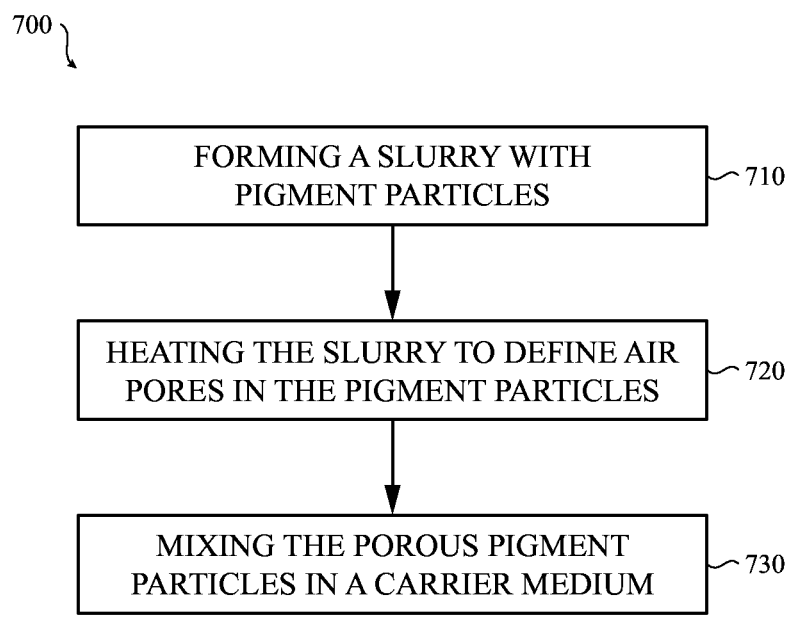
FIG. 7 depicts a flow chart illustrating a first example method for producing a refractive coating.

FIG. 7 depicts a flow chart illustrating a first example method 700 for producing a refractive coating. The refractive coating may be the refractive coating of FIGS. 1-3.

At 710, a slurry may be formed with pigment particles. The slurry may include water and various binders. The pigment particles may include $TiO_2$ particles.

At 720, the slurry may be heated to define voids or air pores in the pigment particles, rendering the pigment particles porous. Heating may burn off water and/or the various binders. Burning off of these materials may form the voids. The heating may partially or fully sinter the pigment particles. Various properties of the heating may be controlled to influence the size of the voids and/or the dispersion of the voids in the pigment particles.

At 730, the porous pigment particles may be mixed in a carrier medium. For example, such a carrier medium may be a polymer matrix. However, it is understood that this is an example. In various implementations, various other carrier media such as ceramics may be used without departing from the scope of the present disclosure.

Although the example method 700 is illustrated and described as including particular operations performed in a particular order, it is understood that this is an example. In various implementations, various orders of the same, similar, and/or different operations may be performed without departing from the scope of the present disclosure.

For example, in some implementations, the method 700 may include the additional operation of spray drying the slurry without departing from the scope of the present disclosure. Such an additional operation may be performed before the operation of heating. However, in other implementations, such an additional operation may be performed during and/or after the operations of heating.

By way of another example, in various implementations, the method 700 may include forming a material such as an ink, plastic, or paint using the mixed porous pigment particles and carrier medium. Formation of such a material may include the addition of one or more other elements to the mixed porous pigment particles and carrier medium. Alternatively, such a material may be formed out of the mixed porous pigment particles and carrier medium itself without additions.

Figure 8:
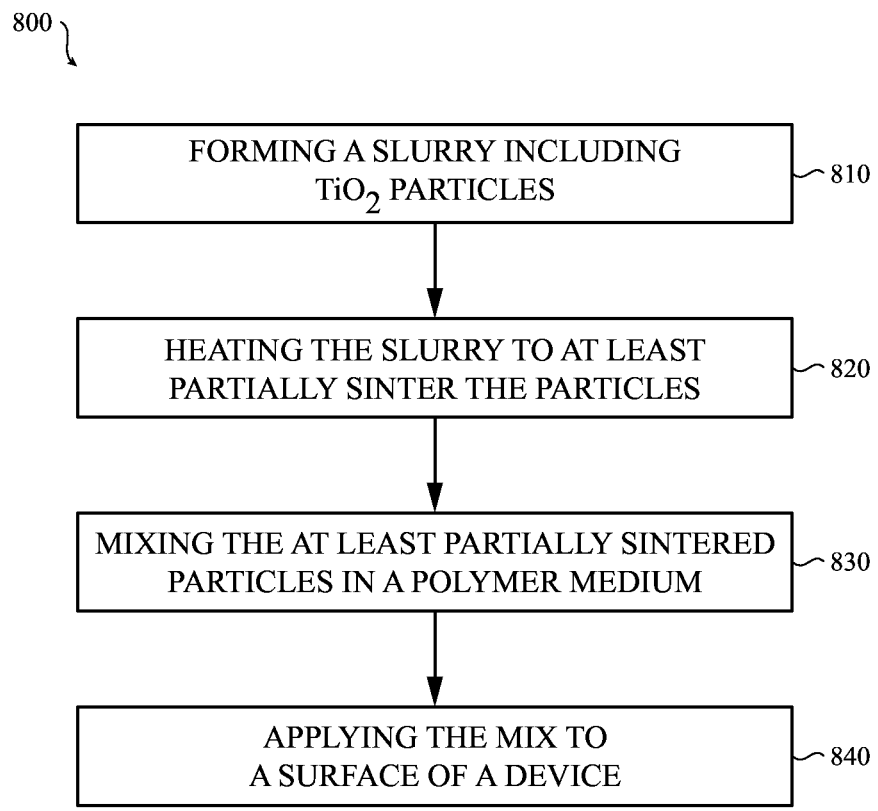
FIG. 8 depicts a flow chart illustrating a second example method for producing a refractive coating.

FIG. 8 depicts a flow chart illustrating a second example method 800 for producing a refractive coating. The refractive coating may be the refractive coating of FIGS. 1-3.

At 810, a slurry may be formed including $TiO_2$ particles. The slurry may include various other materials, such as one or more ceramic powders. Forming the slurry may include pressing the slurry to form a green state material.

At 820, the slurry may be heated to at least partially sinter the $TiO_2$ particles. Such heating may be performed at lower temperatures and/or for shorter amounts of time than would be used to fully sinter the $TiO_2$ particles. Such heating may burn off one or more materials in the slurry other than the $TiO_2$ particles to define gaps or voids in the $TiO_2$ particles.

For example, fully sintering the $TiO_2$ particles may involve heating at a temperature of approximately 1500 degrees Celsius for 24 hours. By way of contrast, partially sintering may involve heating at a temperature between 900 degrees Celsius for five hours. However, it is understood that this is an example and that the heating may be performed at various temperatures for various periods of time without departing from the scope of the present disclosure.

At 830, at least partially sintered $TiO_2$ particles may be mixed in a polymer matrix. Mixing the at least partially sintered $TiO_2$ particles with the polymer matrix may include heating the polymer matrix to a molten state and then mixing in the at least partially sintered $TiO_2$ particles. Alternatively, mixing the at least partially sintered $TiO_2$ particles with the polymer matrix may include mixing the mixing in the at least partially sintered $TiO_2$ particles into the polymer matrix while the polymer matrix is in a liquid state due to the presence of a solvent which may later be removed to transition the mix to a solid state (such as by heating, evaporation, and so on).

At 840, the mix may be applied to the surface of a device. The mix may be applied while in a liquid state and then transitioned to a solid state. Such a surface may be an external surface of the device, and internal surface of the device, and so on.

In some implementations, such a surface may be an interior surface of a cover glass of a display. In such implementations, the mix may be a white ink. However, it is understood that this is an example and that inks of other colors may be produced using one or more of the techniques disclosed herein.

Although the example method 800 is illustrated and described as including particular operations performed in a particular order, it is understood that this is an example. In various implementations, various orders of the same, similar, and/or different operations may be performed without departing from the scope of the present disclosure.

For example, the method 800 is illustrated and described as applying the mix to the surface of a device. However, it is understood that this is an example. In various implementations, the mix may be used in other ways without departing from the scope of the present disclosure. For example, in some implementations, the mix may be formed into solid sheets that may be incorporated into a device instead of applying the mix to the surface of a device.

By way of another example, the method 800 is illustrated and described as heating the slurry to at least partially sinter the $TiO_2$ particles. However in various implementations, the $TiO_2$ particles may be lasered to define pockets, gaps, voids, other structures rather than heating the slurry without departing from the scope of the present disclosure. Various processes are possible and contemplated.

Figure 9:
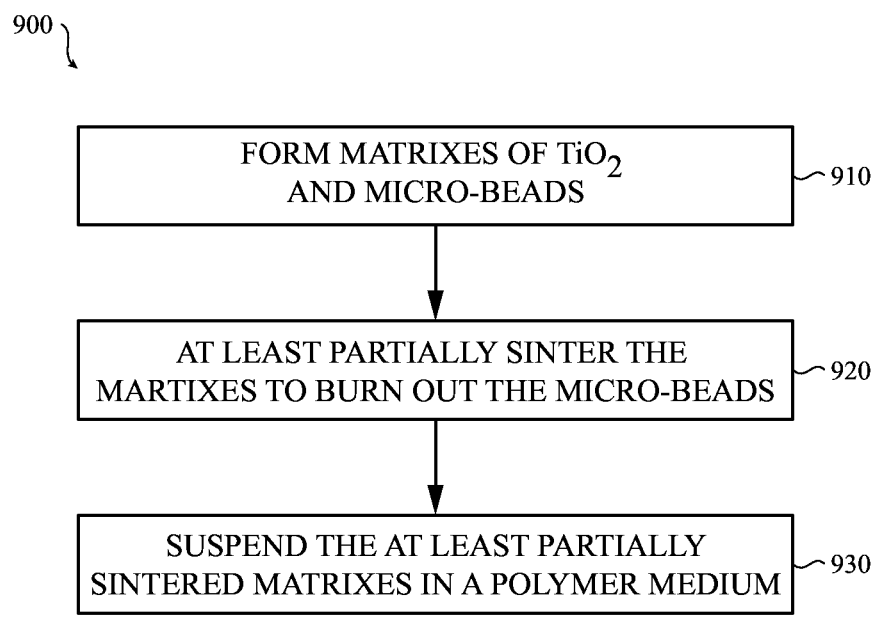
FIG. 9 depicts a flow chart illustrating a third example method for producing a refractive coating.

FIG. 9 depicts a flow chart illustrating a third example method 900 for producing a refractive coating. The refractive coating may be the refractive coating of FIGS. 1-3.

At 910, matrixes of $TiO_2$ particles and micro-beads may be formed. Such micro-beads may be a fluoropolymer (such as polytetrafluoroethylene or polyethylene) or other polymer. However, such micro-beads may be formed of a variety of other materials such as carbon fibers without departing from the scope of the present disclosure. In some implementations, the micro-beads may be selected with dimensions corresponding to the dimensions of pores to be formed in the matrixes.

At 920, the matrixes may be at least partially sintered to burn out the micro-beads. This may form gaps, air bubbles, voids, or other pores in the at least partially sintered matrixes. Such gaps may be internal, external, and/or a combination thereof.

At 930, the at least partially sintered matrixes may be suspended in a polymer matrix and/or other carrier medium.

Although the example method 900 is illustrated and described as including particular operations performed in a particular order, it is understood that this is an example. In various implementations, various orders of the same, similar, and/or different operations may be performed without departing from the scope of the present disclosure.

For example, although the method 900 is illustrated and described as forming matrixes of $TiO_2$ particles and micro-beads, it is understood that this is an example. In various implementations, particles other than $TiO_2$ particles may be used without departing from the scope of the present disclosure. For example, in some implementations, the matrixes may be formed of titanium zinc oxide and micro-beads.

Further, although the method 900 is illustrated and described as forming matrixes of $TiO_2$ particles and micro-beads, it is understood that this is an example. In various implementations, particles of various sizes and shapes other than micro-beads may be used without departing from the scope of the present disclosure.

As described above and illustrated in the accompanying figures, the present disclosure relates to a refractive material, such as a coating disposed on a surface of a portable electronic device. The refractive material includes particles suspended in a carrier medium; each particle defines voids or pores. The difference between the refractive indexes of the voids and the particles is greater than that between the carrier medium and the particles. Incident light is refracted at interfaces between the voids and the particles instead of interfaces between the carrier medium and the particles. As a result, more light is refracted by the refractive material than if particles without voids were used. Thus, the refractive material may appear brighter to the eyes of an observer. In implementations where the refractive material is white, the refractive material may also appear whiter.

In the present disclosure, the methods disclosed may be implemented as sets of instructions or software readable or executable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A portable electronic device, comprising:
a housing component; and
a layer disposed on the housing component, comprising:
    a matrix; and
    pigment particles suspended in the matrix, each pigment particle comprising voids disposed therein;
wherein a difference in refractive indexes between the voids and the pigment particles is greater than a difference in refractive indexes between the matrix and the pigment particles.

2. The portable electronic device of claim 1, wherein the matrix permits incident light to travel through the voids to the pigment particles.

3. The portable electronic device of claim 1, wherein the pigment particles are titanium dioxide.

4. The portable electronic device of claim 1, wherein the layer refracts at least 15% of incident light.

5. The portable electronic device of claim 1, wherein the matrix comprises a polymer.

6. The portable electronic device of claim 1, wherein:
the housing component is transparent; and
the layer is a white ink disposed on an interior surface of the housing component.

7. The portable electronic device of claim 6, wherein the housing component comprises a cover glass of a display.

8. A refractive coating, comprising:
a carrier medium; and
porous pigment particles suspended in the carrier medium and each of the porous pigment particles comprising voids defined therein; wherein incident light is refracted at an interface between the porous pigment particles and voids.

9. The refractive coating of claim 8, wherein the carrier medium is a ceramic.

10. The refractive coating of claim 8, wherein the porous pigment particles are between 200 and 300 nanometers in diameter.

11. The refractive coating of claim 8, wherein the porous pigment particles comprise titanium dioxide matrixes with air bubbles suspended therein.

12. The refractive coating of claim 8, wherein the carrier medium-comprises at least one of ink or paint.

13. The refractive coating of claim 8, wherein a difference in refractive indexes between the porous pigment particles and the voids is greater than one.

14. The portable electronic device of claim 1, wherein the voids comprise at least one of air, gas pockets, or vacuum.

* * * * *